(12) United States Patent
Har et al.

(10) Patent No.: US 6,417,789 B1
(45) Date of Patent: *Jul. 9, 2002

(54) HIGHLY-EFFICIENT COMPRESSION DATA FORMAT

(75) Inventors: David Har, Briarcliff Manor; Kwok-Ken Mak, Wappingers Falls, both of NY (US); Charles O. Schulz, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/569,557

(22) Filed: May 12, 2000

(51) Int. Cl.[7] .................................. H03M 7/00

(52) U.S. Cl. ....................................... 341/60

(58) Field of Search ............................. 341/50, 51, 60, 341/76

(56) References Cited

U.S. PATENT DOCUMENTS

| 4,049,917 A | * | 9/1977 | Copperi et al. ............... 341/76 |
| 5,729,228 A | | 3/1998 | Franaszek et al. ............ 341/51 |

* cited by examiner

*Primary Examiner*—Trong Phan
(74) *Attorney, Agent, or Firm*—Scully, Scott, Murphy & Presser; Derek S. Jennings, Esq.

(57) ABSTRACT

A highly-efficient system and methodology for organizing, storing and/or transmitting compressed data that achieves optimum compression throughput, enhances overall data compressibility, and reduces decompression latency.

31 Claims, 2 Drawing Sheets

HIGHLY-EFFICIENT COMPRESSION DATA FORMAT

BACKGROUND OF THE INVENTION

1. Field of the Invention

This invention relates generally to the field of data compression systems, and more specifically to an improved method and format for organizing, storing and transmitting compressed data.

2. Discussion of the Prior Art

Data compression has become increasingly vital in today's computer systems due to the high demand for data transmission and storage capacity. In particular, main memory compression is now both feasible and desirable with the advent of parallel compression using a cooperative dictionary, as described in commonly-owned U.S. Pat. No. 5,729,228 to Franaszek et al. entitled PARALLEL COMPRESSION AND DECOMPRESSION USING A COOPERATIVE DICTIONARY, incorporated herein by reference. Parallel compression is a relatively new art in the field of compression. Its main concept is to divide a block of uncompressed data into multiple sectors and then assign them to individual engines for both compression and decompression with all engines sharing a cooperative dictionary such that the compression ratio is close to that of a single-engine design. This results in much better latency and throughput than the previous single-engine designs, thus making main memory compression feasible. It is the case however, that latency and throughput objectives may be better achieved provided there is implemented a highly-efficient compressed data format.

It would thus be highly desirable to provide a system and method for organizing compressed data efficiently, particularly, compressed data in parallel format, in order to enhance compression throughput and reduce decompression latency in data storage and data transmission systems.

SUMMARY OF THE INVENTION

It is an object of the invention to provide a system and method for organizing, storing and/or transmitting compressed data efficiently, particularly, by processing compressed data in parallel in order to enhance compression throughput and reduce decompression latency.

It is another object of the invention to provide a system and method that for organizing, storing and/or transmitting compressed data efficiently, particularly, by enabling a compressor mechanism to write out parallel streams of compressed data from multiple engines quickly and with minimal loss of compression ratio and, enabling a decompressor's engines to extract the individual streams of compressed data easily without separate data delimiters and control.

Thus, according to the principles of the invention, there is provided a system and methodology for generating compressed data comprising: inputting information units to one or more parallel executing compression engines and compressing said information units into one or more compressed information units; providing a temporary storage queue associated with each compression engine for temporarily storing one or more compressed information units from its respective compression engine; collecting a compressed information unit in parallel from each temporary storage queue and merging each collected compressed information unit to form a merged word; and, successively forming merged words each comprising collected sets of compressed information units from each temporary storage queue to form a series of merged words for transmission or storage thereof.

BRIEF DESCRIPTION OF THE DRAWINGS

Further features, aspects and advantages of the apparatus and methods of the present invention will become better understood with regard to the following description, appended claims, and accompanying drawings where:

DETAILED DESCRIPTION OF THE PREFERRED EMBODIMENT

Figure 1:
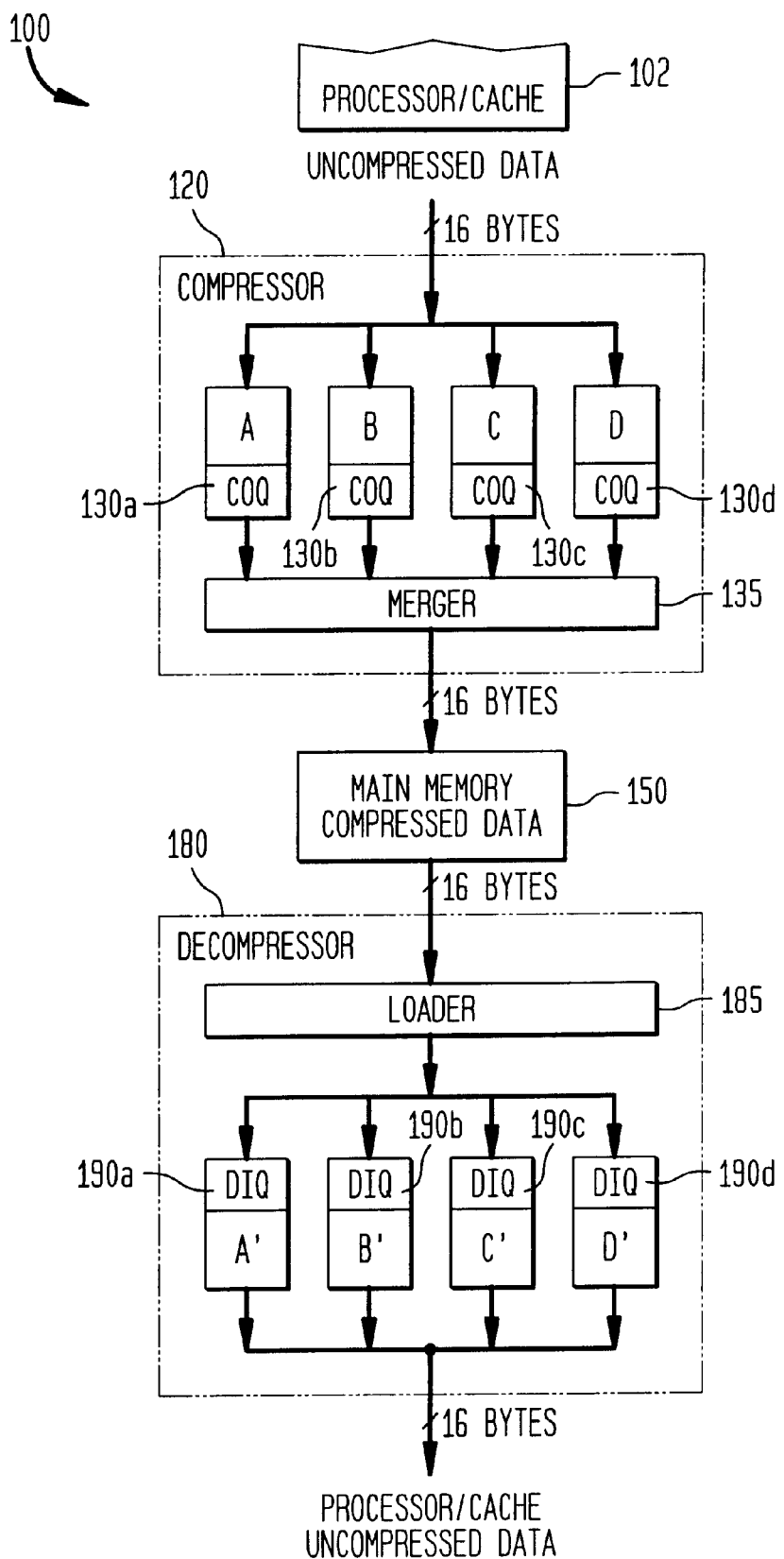
FIG. 1 depicts generally a block diagram of the main memory system of the invention including hardware compressor and decompressor mechanisms.

Referring to FIG. 1, there is depicted a block diagram of a computer system 100 shown including compressor 120, a main memory 150 and decompressor 180 components. In a conventional application, the compressor mechanism 120 converts uncompressed input data received from a processor and/or cache memory component 102 and stores the resulting compressed data in the main memory 150. Subsequently, the decompressor component 180 retrieves the compressed data and converts it back to the original uncompressed data for use in the processor/cache 102. In general, the compressor 120 may comprise two or more parallel, identical engines and, in the embodiment depicted in FIG. 1, it includes four parallel, identical engines indicated as compressor engines labeled A,B,C and D. In the example system depicted in FIG. 1, each block of uncompressed input data, for example, may total 1 Kbyte, which may be divided into four 256-byte sectors, however, it is understood that uncompressed input data may be any multiple byte length, e.g., 512 bytes. During compression, each engine A,B,C and D processes a different (256-byte) sector in parallel, and saves the resultant compressed data in its own corresponding output queue (COQ) 130a, b, . . . , d. As each sector's compressibility will vary, the amount of compressed data in each queue may be different. It should be understood that each of the COQs 130a, b, . . . , d are deep enough to hold even an uncompressible sector. If the total number of compressed data bits is not a multiple of 32, i.e., at a word boundary, then the last compressed word is padded with 0's.

As further shown in FIG. 1, the compressor 120 further includes an output merger stage 135 implementing functionality for collecting 4-byte-wide compressed data words from each engine's COQ 130a, b, . . . , d, and combining them into 16-byte-wide quadwords, for output to the main memory component 150.

Figure 2:
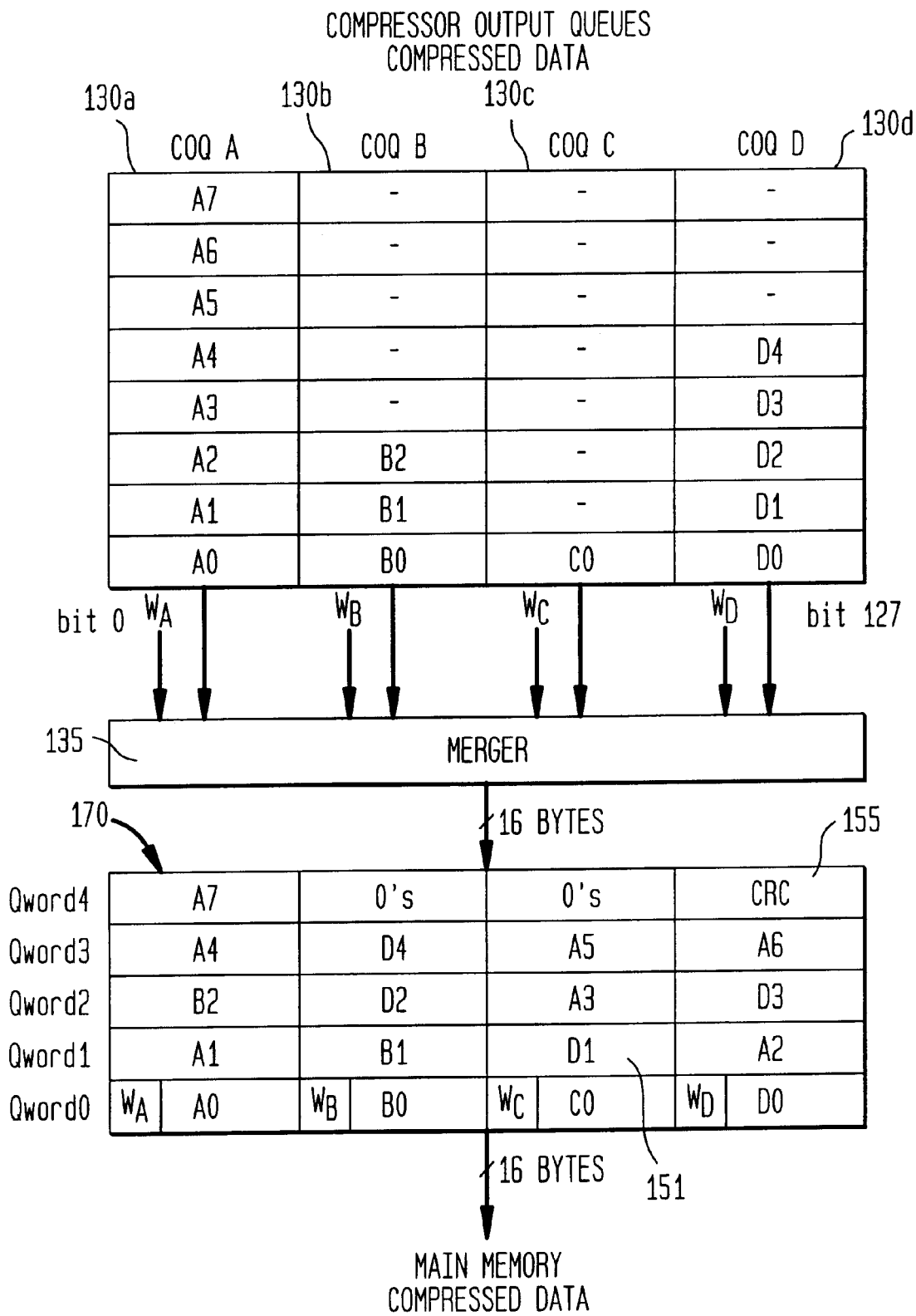
FIG. 2 illustrates an example format for compressing information according to the principals of the present invention.

FIG. 2 illustrates an example of how the merger stage 135 organizes the compressed data words efficiently according to the format disclosed hereafter. In the example depicted, Engine A's COQ 130a, includes compressed data words A0 through A7; Engine B's COQ 130b includes compressed data words B0 through B2, Engine C's COQ 130c includes compressed data words C0 and, Engine D's COQ 130d includes compressed data words D0 through D4. The first compressed word of each COQ, namely words A0, B0 , C0 and D0, also includes a respective byte-wide word count field '$W_A$', '$W_B$', '$W_C$' and '$W_D$' in its most significant byte position, i.e. bits 0 through 7 with each word count field indicating the number of remaining compressed data words for the respective engine. For example, the remaining word count, $W_A$, of COQ A 130*a*, is 0×07 and for COQ C 130*c* the word count field $W_C$. is 0×00. The very first compressed data bits following the word count field starts at bit 8.

At the start of compression output 170, all four COQs 130*a, b, . . . , d*, contribute a compressed data word to the merger stage 135 to form the first quadword (A0, B0, C0, D0). Subsequent quadwords will contain compressed data words in the same queue order. When a COQ has exhausted all its compressed data words, it drops out of the output rotation and its corresponding word slot is filled by the next COQ in sequence. For example, as shown in FIG. 2, the merger stage output at quadword (Qword 1) entry 151 indicates the absence of compressed data for the output queue COQ 130*c* corresponding to engine c, resulting in the insertion of the next successive quadword D1 from the next output queue COQ D 130*d*. When all the queues have exhausted their compressed data words, a 4-byte cyclic redundancy code (CRC) 155 will then be embedded into the least significant word position of the last quadword, i.e., bits 96 to 127. If there is not enough room in the last quadword, then a new quadword will be appended for storing the CRC. This CRC is generated from the original uncompressed 1 Kbyte input data and is to be used by the decompressor to verify the integrity of the compressed data.

Referring back to FIG. 1, there is illustrated a decompressor mechanism 180 including an input "loader" stage 185 having functionality for retrieving the compressed data from the main memory and distributing the data to a corresponding decompressor input queue (DIQ) 190*a, b, . . . , d* associated with a respective parallel decompressor engines A', B', C', and D'. The DIQs 190*a, b, . . . , d* are used as FIFOs for the incoming compressed data words before the latter are processed by the respective engines A', B', C', and D'. The number of decompressor input queues 190*a,b, . . . , d* and corresponding engines A', B', C', and D' are the same as those in the compressor, e.g., four engines in the example depicted. In each engine, compressed data words are first stored in its own DIQ. Given that the compressed data is stored in the main memory using the format disclosed in this invention, it becomes a relatively simple task for the loader 185 to quickly distribute the data to the DIQs for decompression. This, in turns, lowers the decompression latency significantly.

Specifically, at the beginning of decompression, the loader 185 always reads in the first quadword from the main memory. This quadword contains the individual word count '$W_A, W_B, W_C, W_D$' for each engine. The loader uses the word counts to determine how many more quadwords to retrieve and how to distribute the compressed data words. Initially, it always distributes the compressed data words to the engines in sequence, i.e., A0, B0, C0, D0, etc. When the word count for a particular engine has been exhausted, the loader will skip this engine from then on. For example, in FIG. 2, Engine C's word count $W_C$ is 0. Thus, it drops out of the rotation after the first quadword. Eventually, only Engine A has compressed data words in quadwords Qword 3 and Qword 4.

As the compressed data has been stored in an optimum format according to the invention, the decompressor's engines A', B', C', and D' are able to start decompressing the data immediately and simultaneously. This contributes to the low latency as desired for decompression.

While the invention has been particularly shown and described with respect to illustrative and preformed embodiments thereof, it will be understood by those skilled in the art that the foregoing and other changes in form and details may be made therein without departing from the spirit and scope of the invention which should be limited only by the scope of the appended claims.

Having thus described our invention, what we claim as new, and desire to secure by Letters Patent is:

1. A data compression system comprising:
   one or more compression engines executing in parallel for receiving uncompressed information units and compressing said information units into one or more compressed information units;
   a temporary storage queue associated with each compression engine for temporarily storing one or more compressed information units from its respective compression engine; and,
   a merger device for collecting a compressed information unit in parallel from each said temporary storage queue and merging each collected compressed information unit to form a merged word, said merger device successively forming merged words each comprising collected sets of compressed information units from each temporary storage queue to form a series of merged words for transmission or storage thereof.

2. The data compression system as claimed in claim 1, wherein each merged word comprises a collected compressed information unit in queue sequence order.

3. The data compression system as claimed in claim 2, wherein said merger device includes a mechanism for detecting the absence of remaining compressed information units in a temporary storage queue and thereafter terminating collection of data units therefrom, said merger device responding by filling a slot associated with said storage queue and subsequent slots of each said merged words with the next available compressed information units in queue sequence order.

4. The data compression system as claimed in claim 2, wherein said merger device successively merges collected sets of compressed information units from each temporary storage queue until each temporary storage queue is exhausted of compressed information units.

5. The data compression system as claimed in claim 3, further comprising a mechanism for tracking an amount of compressed information units in each temporary storage queue and embedding a word count indicating the tracked amount for each corresponding queue in a first merged word of said series.

6. The data compression system as claimed in claim 5, wherein each word count for each respective queue is embedded in a corresponding most significant bit position of a respective compressed information unit of the first merged word of said series.

7. The data compression system as claimed in claim 1, further comprising:
   mechanism for calculating a CRC code from said original information unit; and,
   mechanism for embedding said CRC code in a last merged word of said series.

8. The data compression system as claimed in claim 7, wherein said CRC code is embedded in a least significant bit position of said last merged word of said series.

9. The data compression system as claimed in claim 3, further implementing a decompression system for generating uncompressed information units, said decompression system comprising:
   one or more decompression engines in one to one correspondence with said one or more compression engines, each decompression engine executing in parallel for receiving transmitted or stored compressed information units; and, a loader device for retrieving said merged words of compressed information units and distributing the compressed information units from each merged word to a corresponding temporary storage queue associated with each decompression engine.

10. The data compression system as claimed in claim 9, wherein said loader device distributes the compressed information units in sequence to a respective decompression engine temporary storage queue, said loader device retaining each said word count corresponding to each compression engine from said first merged word retrieved.

11. The data compression system as claimed in claim 10, wherein said loader device includes a mechanism for utilizing said word count for determining how many merged words to retrieve and how to distribute each said compressed information units, said loader device skipping distribution of compressed information units to a decompression storage queue when a word count for the corresponding compression engine is exhausted.

12. A method for generating compressed data comprising:
   a) inputting information units to one or more parallel executing compression engines and compressing said information units into one or more compressed information units;
   b) providing a temporary storage queue associated with each compression engine for temporarily storing one or more compressed information units from its respective compression engine;
   c) collecting a compressed information unit in parallel from each said temporary storage queue and merging each collected compressed information unit to form a merged word; and,
   d) successively forming merged words each comprising collected sets of compressed information units from each temporary storage queue to form a series of merged words for transmission or storage thereof.

13. The method for generating compressed data as claimed in claim 12, wherein said collecting step c) further comprises collecting each compressed information unit in queue sequence order.

14. The method for generating compressed data as claimed in claim 13, further comprising the steps of:
   tracking an amount of compressed information units in each temporary storage queue; and,
   embedding a word count indicating the tracked amount for each corresponding queue in a first merged word of said series.

15. The method for generating compressed data as claimed in claim 14, wherein said step d) comprises successively merging collected sets of compressed information units from each temporary storage queue until each temporary storage queue is exhausted of compressed information units.

16. The method for generating compressed data as claimed in claim 15, further including the steps of:
   detecting the absence of remaining compressed information units in a temporary storage queue; and, upon detection,
   terminating collection of data units from said storage queue; and
   filling a slot associated with said storage queue and thereafter subsequent slots of each said merged words with the next available compressed information units in queue sequence order.

17. The method for generating compressed data as claimed in claim 14, wherein said embedding step comprises: embedding each word count for each respective queue in a corresponding most significant bit position of a respective compressed information unit of the first merged word of said series.

18. The method for generating compressed data as claimed in claim 12, further comprising the steps of:
   calculating a CRC code from said original information unit; and,
   embedding said CRC code in a last merged word of said series.

19. The method for generating compressed data as claimed in claim 18, wherein said embedding step comprises: embedding said CRC code in a least significant bit position of said last merged word of said series.

20. The method for generating compressed data as claimed in claim 14, further including the steps of:
   providing a loader device for distributing the compressed information units of a merged word in sequence to a respective temporary storage queue associated with a decompression engine corresponding to a compression engine;
   retaining each said word count corresponding to each compression engine from said first merged word retrieved;
   utilizing said word count for determining how many merged words to retrieve; and,
   distributing each said compressed information units of a retrieved merged word to a respective decompression engine storage queue according to said word count.

21. The method for generating compressed data as claimed in claim 20, further including the step of skipping distribution of compressed information units to a decompression storage queue when a word count for the corresponding compression engine is exhausted.

22. A program storage device readable by a machine, tangibly embodying a program of instructions executable by the machine to perform method steps for generating compressed data, said method steps comprising:
   a) inputting information units to one or more parallel executing compression engines and compressing said information units into one or more compressed information units;
   b) providing a temporary storage queue associated with each compression engine for temporarily storing one or more compressed information units from its respective compression engine;
   c) collecting a compressed information unit in parallel from each said temporary storage queue and merging each collected compressed information unit to form a merged word; and,
   d) successively forming merged words each comprising collected sets of compressed information units from each temporary storage queue to form a series of merged words for transmission or storage thereof.

23. The program storage device readable by a machine as claimed in claim 22, wherein said collecting step c) further comprises collecting each compressed information unit in queue sequence order.

24. The program storage device readable by a machine as claimed in claim 23, further comprising the steps of:
   tracking an amount of compressed information units in each temporary storage queue; and,
   embedding a word count indicating the tracked amount for each corresponding queue in a first merged word of said series.

25. The program storage device readable by a machine as claimed in claim 24, wherein said step d) comprises successively merging collected sets of compressed information units from each temporary storage queue until each temporary storage queue is exhausted of compressed information units.

26. The program storage device readable by a machine as claimed in claim 25, further including method steps of:

detecting the absence of remaining compressed information units in a temporary storage queue; and, upon detection, terminating collection of data units from said storage queue; and filling a slot associated with said storage queue and thereafter subsequent slots of each said merged words with the next available compressed information units in queue sequence order.

27. The program storage device readable by a machine as claimed in claim 24, wherein said embedding step comprises: embedding each word count for each respective queue in a corresponding most significant bit position of a respective compressed information unit of the first merged word of said series.

28. The program storage device readable by a machine as claimed in claim 22, further comprising the steps of:

calculating a CRC code from said original information unit; and, embedding said CRC code in a last merged word of said series.

29. The program storage device readable by a machine as claimed in claim 28, wherein said embedding step comprises: embedding said CRC code in a least significant bit position of said last merged word of said series.

30. The program storage device readable by a machine as claimed in claim 24, providing a loader device for distributing the compressed information units of a merged word in sequence to a respective temporary storage queue associated with a decompression engine corresponding to a compression engine;

retaining each said word count corresponding to each compression engine from said first merged word retrieved;

utilizing said word count for determining how many merged words to retrieve; and, distributing each said compressed information units of a retrieved merged word to each decompression engine storage queue according to said word count.

31. The program storage device readable by a machine as claimed in claim 30, further including the step of skipping distribution of compressed information units to a decompression engine storage queue when a word count for the corresponding compression engine is exhausted.

* * * * *